United States Patent
Lin et al.

(10) Patent No.: US 10,522,533 B1
(45) Date of Patent: Dec. 31, 2019

(54) THREE-DIMENSIONAL CIRCUIT STRUCTURE

(71) Applicant: PIN SHINE INDUSTRIAL CO., LTD., New Taipei (TW)

(72) Inventors: Chih-Hung Lin, New Taipei (TW); Kun-Chuan Chang, New Taipei (TW)

(73) Assignee: PIN SHINE INDUSTRIAL CO., LTD. (TW)

( * ) Notice: Subject to any disclaimer, the term of this patent is extended or adjusted under 35 U.S.C. 154(b) by 0 days.

(21) Appl. No.: 16/016,895

(22) Filed: Jun. 25, 2018

(51) Int. Cl.
*H01L 27/06* (2006.01)
*H01L 23/532* (2006.01)
*H01L 23/00* (2006.01)
*H01L 23/31* (2006.01)

(52) U.S. Cl.
CPC ...... *H01L 27/0688* (2013.01); *H01L 23/3157* (2013.01); *H01L 23/5329* (2013.01); *H01L 23/562* (2013.01); *H01L 23/564* (2013.01); *H01L 23/573* (2013.01)

(58) Field of Classification Search
CPC ............. H01L 27/0688; H01L 23/3157; H01L 23/5329; H01L 23/562; H01L 23/564; H01L 23/573
See application file for complete search history.

(56) References Cited

U.S. PATENT DOCUMENTS

| | | | | |
|---|---|---|---|---|
| 4,757,414 A | * | 7/1988 | Barker | ...................... H01G 2/14 361/15 |
| 5,466,480 A | * | 11/1995 | Zhou | ................ G01R 33/34046 427/124 |
| 2010/0321905 A1 | * | 12/2010 | Liu | .................. G06K 19/07743 361/752 |

* cited by examiner

*Primary Examiner* — James Wu
*Assistant Examiner* — Hung Q Dang
(74) *Attorney, Agent, or Firm* — Schmeiser, Olsen & Watts, LLP (57) ABSTRACT

A three-dimensional (3D) circuit structure includes a 3D insulating substrate having at least one circuit forming zone and at least one exposed contact forming zone; at least one circuit pattern portion provided on the 3D insulating substrate and having at least one circuit trace layout layer located in the circuit forming zone and at least one exposed contact located in the exposed contact forming zone and connected to the circuit trace layout layer; and an insulating encapsulation member covering at least the circuit forming zone and the circuit trace layout layer. With the insulating encapsulation member, the circuit trace layout layer is waterproof, dustproof, scratch-resistant, peeling-proof, secure for use, and compliant with safety codes of electrical insulation, enabling the 3D circuit structure in use to have stable electrical characteristics.

1 Claim, 12 Drawing Sheets

THREE-DIMENSIONAL CIRCUIT STRUCTURE

FIELD OF THE INVENTION

The present invention relates to a three-dimensional (3D) circuit structure, and more particularly to a 3D circuit structure that is waterproof, dustproof, scratch-resistant, peeling-proof, secure for use, and compliant with safety codes of electrical insulation.

BACKGROUND OF THE INVENTION

Due to the trend of developing miniaturized, lightweight and multi-functional electronic products, 3D designs of electronic elements and circuits have now become inevitable. By way of designing 3D circuit structures, complicate circuits can be realized within a further limited space and electronic products can be further reduced in volume without adversely affecting their intended functions.

Currently, the frequently adopted techniques for fabricating 3D circuits include double-injection molding, laser direct structuring, in-mold decoration injection molding, 3D photo imaging, hot embossing, capture decal and so on. Among others, laser direct structuring is the most common technique for forming a 3D circuit structure, but it has the disadvantages of relatively high cost. On the other hand, the in-mold decoration injection molding frequently has the problems of ink washout, deformed film, poor adhesion between the hot melt plastic and film.

However, with respect to the currently available 3D circuits, no matter how they are fabricated, they all have metal conducting traces formed on the surfaces of a carrier. Further, the exterior of the carrier is not protected by any means and the metal conducting traces formed thereon are exposed to an open space. Therefore, the conventional 3D circuits are easily subjected to moisture, dust and scratch when they are touched or undergoing subsequent fabrication processes. Besides, the metal conducting traces have poor adhesion to the surfaces of the carrier and tend to peel off when they are touched or undergoing subsequent fabrication processes, which will adversely affect the electrical characteristics of the 3D circuit structure in use. Further, since the metal conducting traces are exposed to the open space, the circuit trace layout of the conventional 3D circuit is not secure for use and fails to comply with relevant safety codes of electrical insulation.

It is therefore tried by the inventor to develop a 3D circuit structure that is waterproof, dustproof, scratch-resistant, peeling-proof, secure for use, and compliant with safety codes of electrical insulation, enabling the 3D circuit structure in use to have stable electrical characteristics.

SUMMARY OF THE INVENTION

To overcome the drawbacks in the prior art 3D circuits, it is a primary object of the present invention to provide an improved 3D circuit structure, which includes an insulating encapsulation member for covering a circuit trace layout layer, so that the circuit trace layout layer is waterproof, dustproof, scratch-resistant, peeling-proof, secure for use, and compliant with safety codes of electrical insulation, enabling the 3D circuit structure in use to have stable electrical characteristics.

To achieve the above and other objects, the 3D circuit structure according to a preferred embodiment of the present invention includes a 3D insulating substrate, at least one circuit pattern portion and an insulating encapsulation member. The 3D insulating substrate includes at least one circuit forming zone and at least one exposed contact forming zone; the circuit pattern portion is provided on the 3D insulating substrate and includes at least one circuit trace layout layer located in the circuit forming zone and at least one exposed contact located in the exposed contact forming zone and connected to the circuit trace layout layer; and the insulating encapsulation member covers at least the circuit forming zone and the circuit trace layout layer.

In the 3D circuit structure according to the present invention, the 3D insulating substrate can be a straight flat plate or a curved member.

In the aforesaid 3D circuit structure, the circuit forming zone can be in the form of a flat plate, and the circuit trace layout layer is located on a surface of the circuit forming zone; and the exposed contact forming zone can be in the form of a flat plate, and the exposed contacts are located on a surface of the exposed contact forming zone.

In the aforesaid 3D circuit structure, the circuit forming zone can be in the form of a flat plate, and the circuit trace layout layer is located on a surface of the circuit forming zone; and the exposed contact forming zone can be provided with at least two exposed-contact receiving recesses, and the exposed contacts are located in the exposed-contact receiving recesses.

In the aforesaid 3D circuit structure, the circuit forming zone can be provided with at least one circuit-trace receiving recess and the exposed contact forming zone can be provided with at least two exposed-contact receiving recesses communicable with the circuit-trace receiving recess; the circuit trace layout layer are located in the circuit-trace receiving recess, and the exposed contacts are located in the exposed-contact receiving recesses.

In the aforesaid 3D circuit structure, the circuit forming zone can be located on a surface of the 3D insulating substrate, the 3D insulating substrate can include at least two exposed contact forming zones; and the circuit trace layout layer is located in the circuit forming zone and the exposed contact forming zones respectively have one exposed contact provided therein to form a single-sided 3D circuit structure.

In the 3D circuit structure according to the present invention, the 3D insulating substrate can be provided on each of two opposite surfaces with one circuit forming zone and one exposed contact forming zone. The two circuit forming zones respectively include one circuit trace layout layer, which are communicable with each other; and the two exposed contact forming zones respectively include one exposed contact. Therefore, a double-sided 3D circuit structure is formed.

In the aforesaid double-sided 3D circuit structure, the 3D insulating substrate can be provided with a passage section, via which the two circuit forming zones provided on the two opposite surfaces of the 3D insulating substrate communicate with each other. And, the two circuit trace layout layers provided on the two opposite surfaces of the 3D insulating substrate can respectively include an electrical conduction section, and the two electrical conduction sections are located in the passage section to connect to each other.

In the 3D circuit structure of the present invention, the 3D insulating substrate can be in the form of a hollow cylindrical member, and an insulating intermediate layer can be further included and located between the 3D insulating substrate and the insulating encapsulation member; and the insulating intermediate layer can include a conductor receiving recess having at least one passage section communicable with the circuit trace layout layer located on the 3D insulating substrate. The conductor receiving recess has a conductor disposed therein, and the conductor includes an electrical conduction section located in the at least one passage section and connected to the circuit trace layout layer. Therefore, a cylindrical 3D circuit structure is formed.

In the aforesaid cylindrical 3D circuit structure, the insulating intermediate layer includes a notch located corresponding to the exposed contact; and the insulating encapsulation member includes a first notch section located corresponding to the notch and the exposed contact, and a second notch section located corresponding to an end of the conductor.

With the above arrangements, the insulating encapsulation member included in the 3D circuit structure according to the present invention enables the circuit trace layout layer to be waterproof, dustproof, scratch-resistant, peeling-proof, secure for use and compliant with safety codes of electrical insulation, which in turn makes the whole 3D circuit structure of the present invention in use have stable electrical characteristics.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some preferred embodiments thereof and by referring to the accompanying drawings. For the purpose of easy to understand, elements that are the same in the preferred embodiments are denoted by the same reference numerals.

Figure 1:
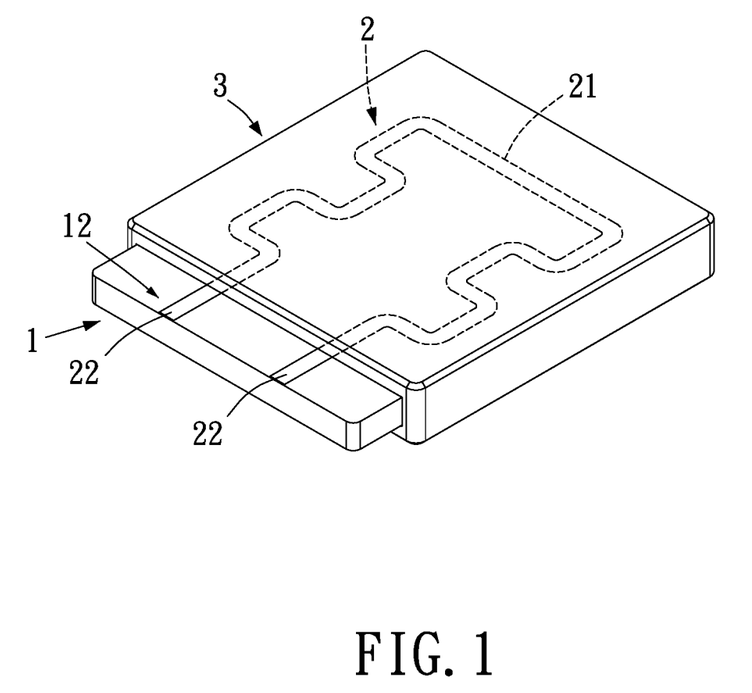
FIG. 1 is a perspective view of a three-dimensional (3D) circuit structure according to a first preferred embodiment of the present invention.
Figure 2:
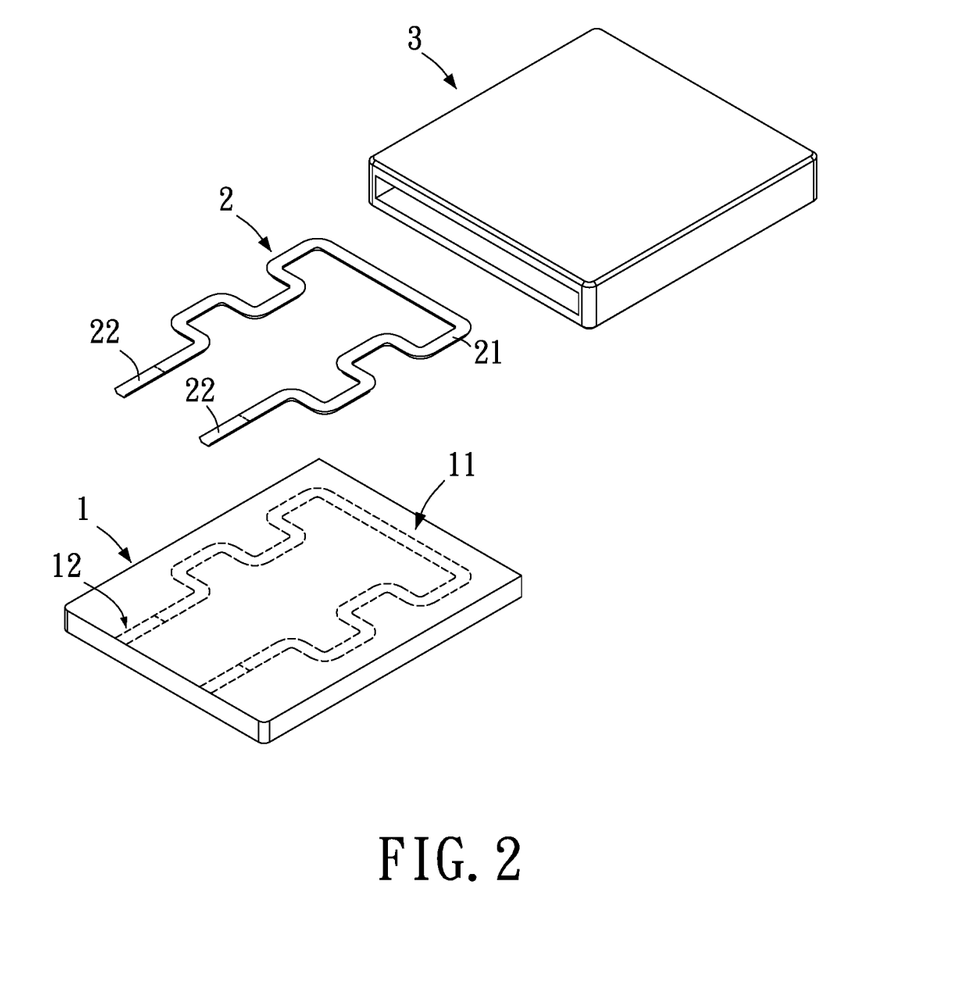
FIG. 2 is an exploded view of FIG. 1.

Please refer to FIGS. 1 and 2, which are assembled and exploded perspective views, respectively, of a three-dimensional (3D) circuit structure according to a first preferred embodiment of the present invention. As shown, the 3D circuit structure in the first preferred embodiment includes a 3D insulating substrate 1, at least one circuit pattern portion 2 and an insulating encapsulation member 3.

The 3D insulating substrate 1 includes at least one circuit forming zone 11 and at least one exposed contact forming zone 12. The 3D insulating substrate 1 can be made of a plastic material, a rubber material, a thermoplastic plastic material, or an epoxy resin material. The circuit forming zone 11 is located on a surface of the 3D insulating substrate 1, and the exposed contact forming zone 12 can be located at any position on the 3D insulating substrate 1. In the illustrated first preferred embodiment, the exposed contact forming zone 12 is located on the 3D insulating substrate 1 at a position adjacent to one peripheral edge thereof.

The circuit pattern portion 2 is provided on the 3D insulating substrate 1, and includes at least one circuit trace layout layer 21 located in the circuit forming zone 11 and at least one exposed contact 22 located in the exposed contact forming zone 12 and connected to the circuit trace layout layer 21. In the illustrated first preferred embodiment, there are shown one circuit pattern portion 2, one circuit trace layout layer 21 and two exposed contacts 22, and the circuit trace layout layer 21 is integrally formed with the exposed contacts 22. The circuit pattern portion 2 can be formed of a metal material, such as copper, iron, gold or tin.

The insulating encapsulation member 3 covers at least the circuit forming zone 11 and the circuit trace layout layer 21, and can be made of a plastic material, a rubber material, a thermoplastic plastic material, or an epoxy resin material.

When fabricating the 3D circuit structure of the present invention, the circuit trace layout layer 21 can be formed in the circuit forming zone 11 and the exposed contacts 22 can be formed in the exposed contact forming zone 12 using laser, electroplating, or a combination of laser and chemical plating. Thereafter, the circuit forming zone 11 and the circuit trace layout layer 21 are covered using the encapsulation member 3, while the exposed contacts 22 are allowed to expose to an open space. In this manner, the circuit pattern portion 2 is formed on one surface of the 3D insulating substrate 1 to provide a single-sided 3D circuit structure with the circuit trace layout layer 21 enclosed in the insulating encapsulation member 3. Therefore, the circuit trace layout layer 21 of the 3D circuit structure according to the first preferred embodiment of the present invention is waterproof, dustproof, scratch-resistant, peeling-proof, secure for use, and compliant with safety codes of electrical insulation.

According to the present invention, the 3D insulating substrate 1 can be in the form of a straight flat plate or a curved member, depending on actual need in use. In the illustrated first preferred embodiment, the 3D insulating substrate 1 is in the form of a straight flat plate. Further, the circuit forming zone 11 is in the form of a flat plate, and the circuit trace layout layer 21 of the circuit pattern portion 2 is located on a surface of the circuit forming zone 11; meanwhile the exposed contact forming zone 12 is in the form of a flat plate, and the exposed contacts 22 are located on a surface of the exposed contact forming zone 12. With these arrangements, the circuit trace layout layer 21 and the exposed contacts 22 can be formed on the 3D insulating substrate 1 to follow a surface contour thereof, making the present invention more practical for use.

Figure 3:
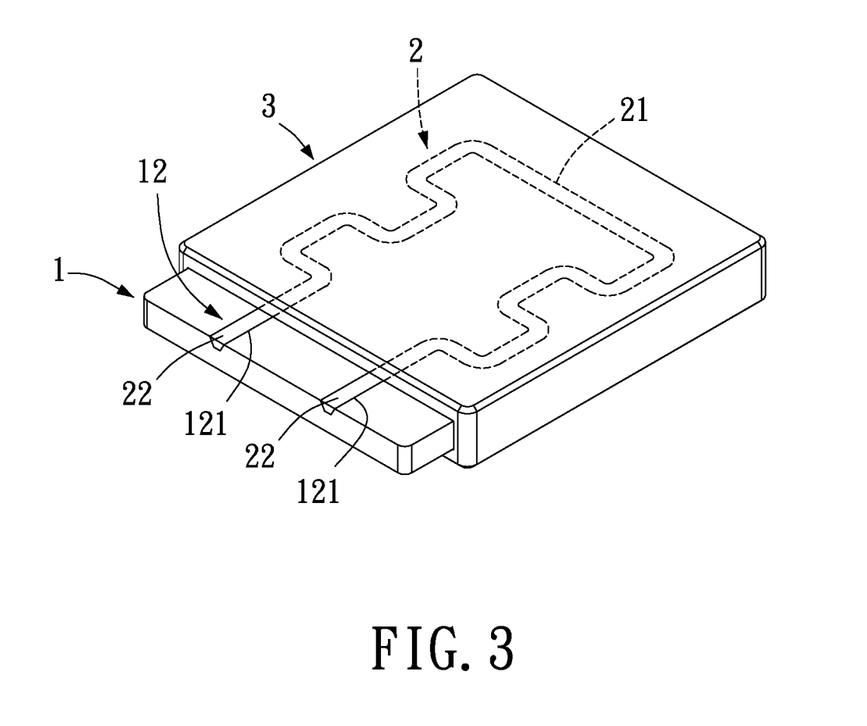
FIG. 3 is a perspective view of a 3D circuit structure according to a second preferred embodiment of the present invention.
Figure 4:
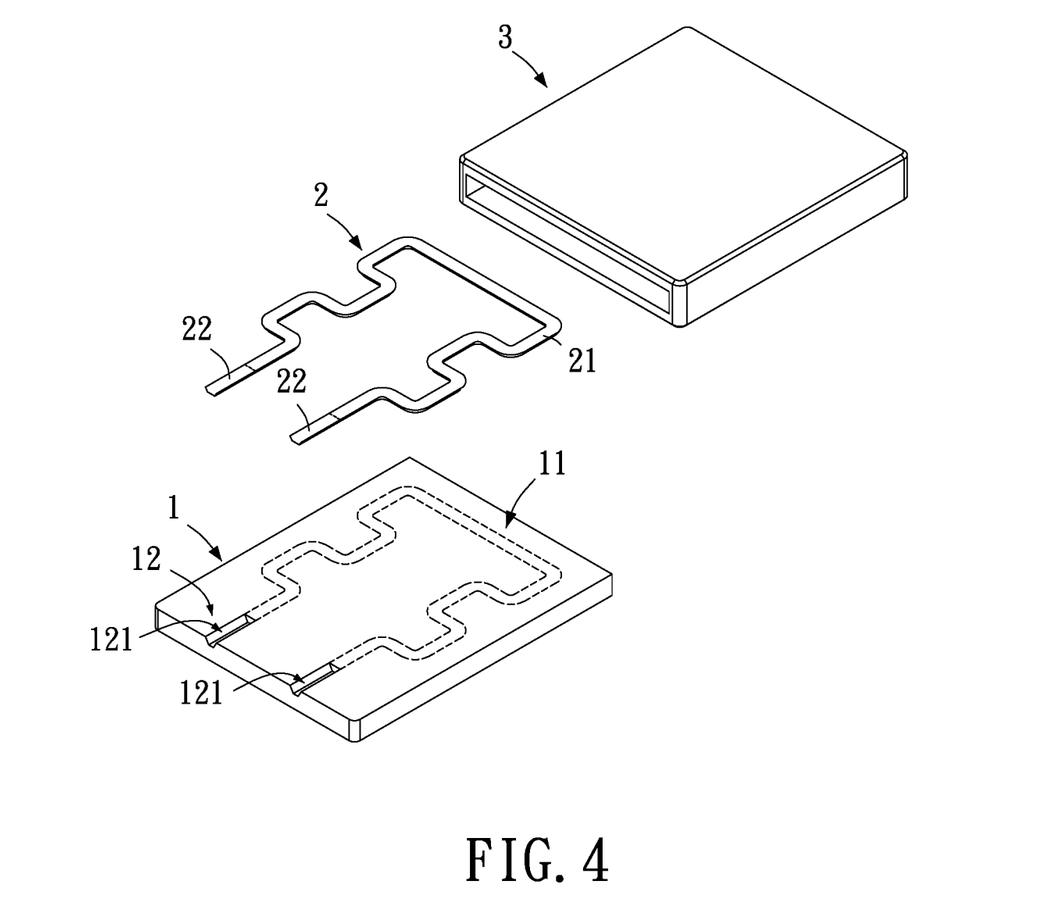
FIG. 4 is an exploded view of FIG. 3.

Please refer to FIGS. 3 and 4, which are assembled and exploded perspective views, respectively, of a 3D circuit structure according to a second preferred embodiment of the present invention. In the second preferred embodiment, the circuit forming zone 11 on the 3D insulating substrate 1 is in the form of a flat plate, the circuit trace layout layer 21 is located on a surface of the circuit forming zone 11; but at least two exposed-contact receiving recesses 121 are formed in the exposed contact forming zone 12, and the exposed contacts 22 are located in the exposed-contact receiving recesses 121. With these arrangements, the exposed contacts 22 so formed have better adhesion to the 3D insulating substrate 1 without easily separating therefrom to thereby facilitate subsequent processing operations, making the present invention more practical for use.

Figure 5:
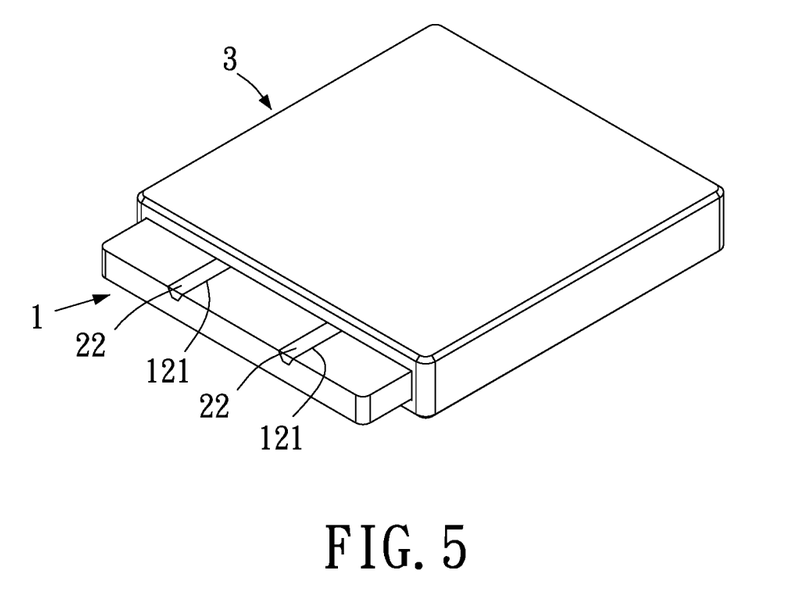
FIG. 5 is a perspective view of a 3D circuit structure according to a third preferred embodiment of the present invention.
Figure 6:
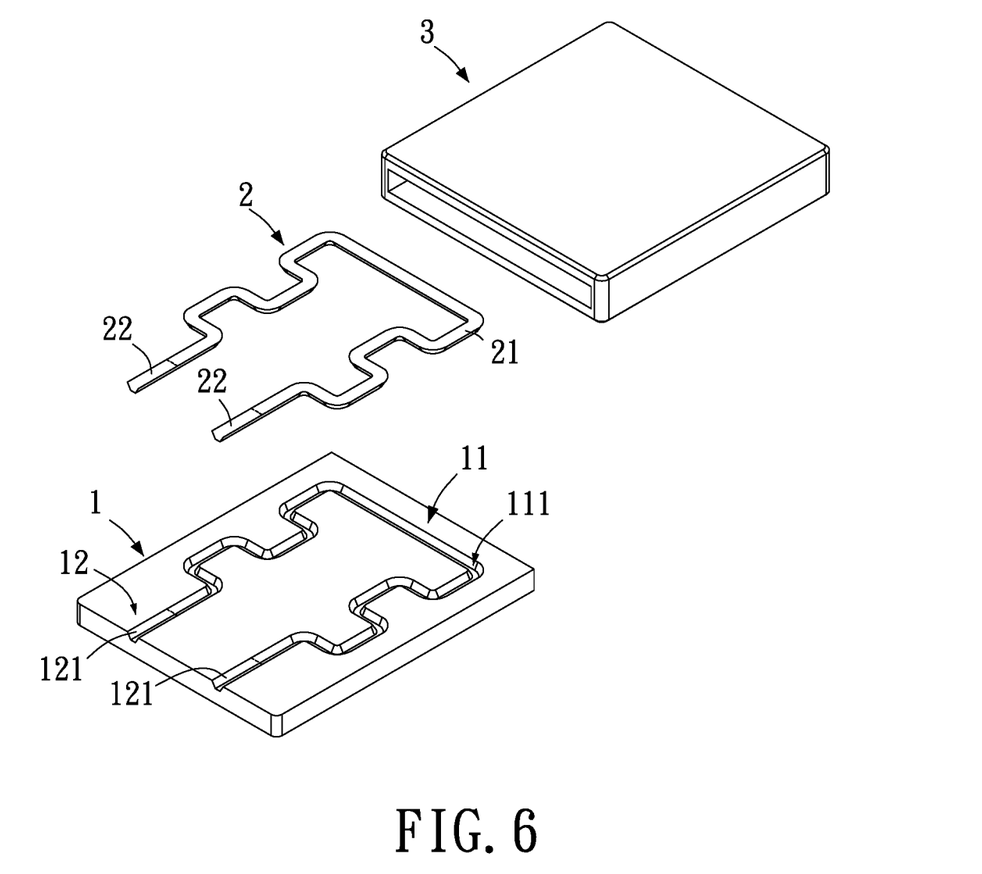
FIG. 6 is an exploded view of FIG. 5.
Figure 7:
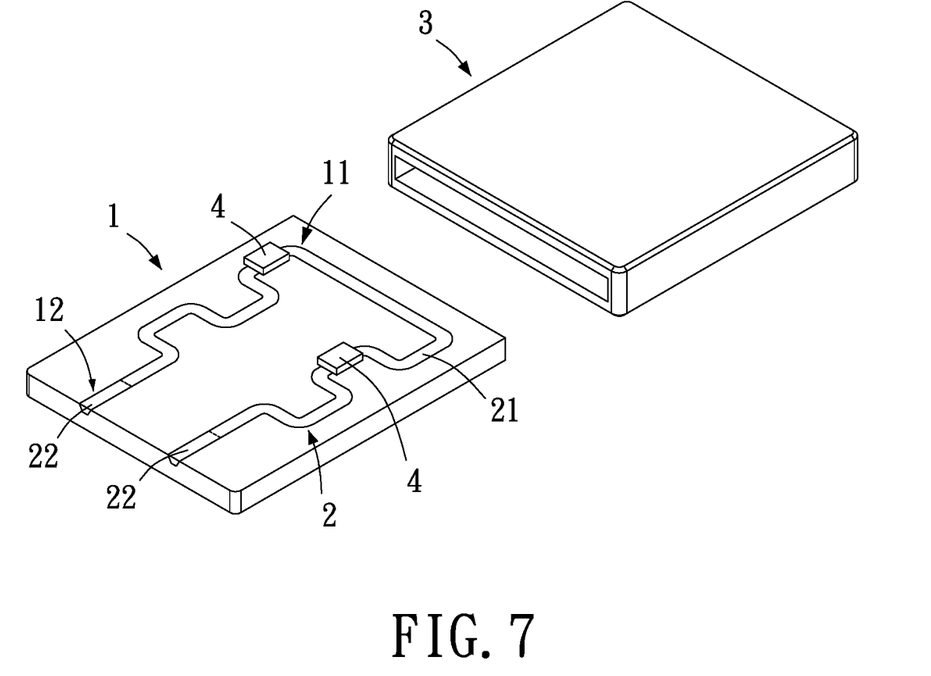
FIG. 7 shows the 3D circuit structure according to the third preferred embodiment of the present invention has electronic components connected thereto.

Please refer to FIGS. 5 to 7, in which a 3D circuit structure according to a third preferred embodiment of the present invention is shown. In the third preferred embodiment, the circuit forming zone 11 includes at least one circuit-trace receiving recess 111; and the exposed contact forming zone 12 includes at least two exposed-contact receiving recesses 121, which are communicable with the circuit-trace receiving recess 111. The circuit trace layout layer 21 is received in the circuit-trace receiving recess 111, and the exposed contacts 22 are received in the exposed-contact receiving recesses 121. With these arrangements, the circuit trace layout layer 21 and the exposed contacts 22 so formed have better adhesion to the 3D insulating substrate 1 without easily separating therefrom to thereby facilitate subsequent processing operations.

After the circuit pattern portion 2 is formed on the 3D insulating substrate 1, relevant electronic elements 4 can be provided on the circuit trace layout layer 21, as shown in FIG. 7. In this case, the insulating encapsulation member 3 encloses at least the circuit forming zone 11, the circuit trace layout layer 21 and the electronic elements 4; and the exposed contacts 22 can be electrically connected to a related apparatus or other electronic components (not shown). With these arrangements, the 3D circuit structure of the present invention can be applied to a wide range of applications.

Figure 8:
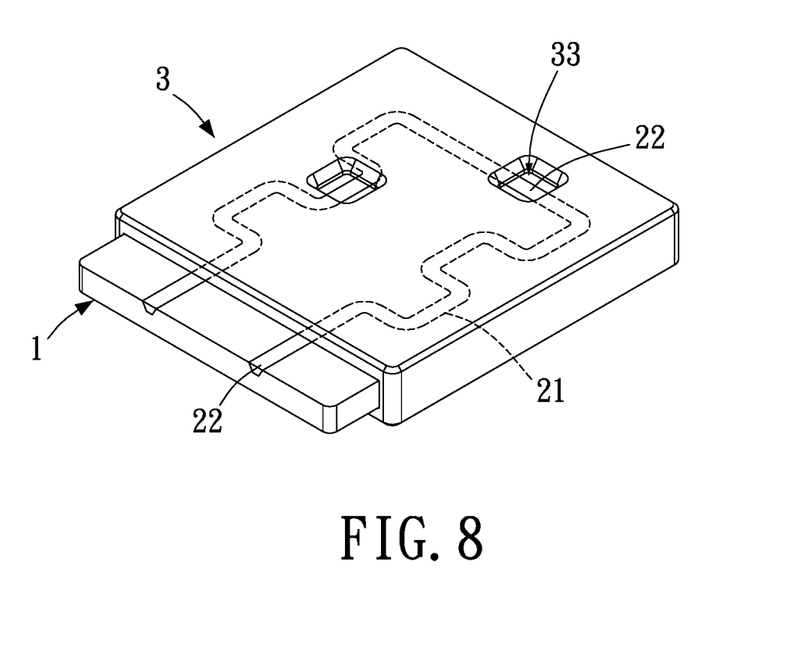
FIG. 8 is a perspective view of a 3D circuit structure according to a fourth preferred embodiment of the present invention.

Please refer to FIG. 8, which is a perspective view of a 3D circuit structure according to a fourth preferred embodiment of the present invention. In the fourth preferred embodiment, the insulating encapsulation member 3 can be provided at any location with one or more windows 33, so that sections of the circuit trace layout layer 21 corresponding to the windows 33 form additional exposed contacts 22. With these arrangements, the exposed contacts 22 can be provided on the 3D insulating substrate 1 not only at positions adjacent to a peripheral edge thereof, but also at other positions according to actual need in design, making the present invention more practical for use.

Figure 9:
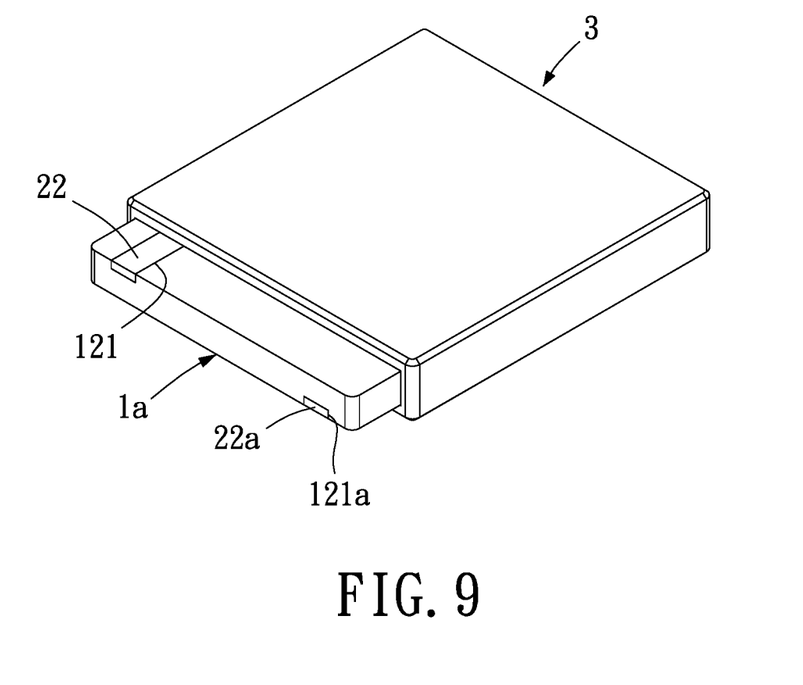
FIG. 9 is an assembled perspective view of a 3D circuit structure according to a fifth preferred embodiment of the present invention.
Figure 10:
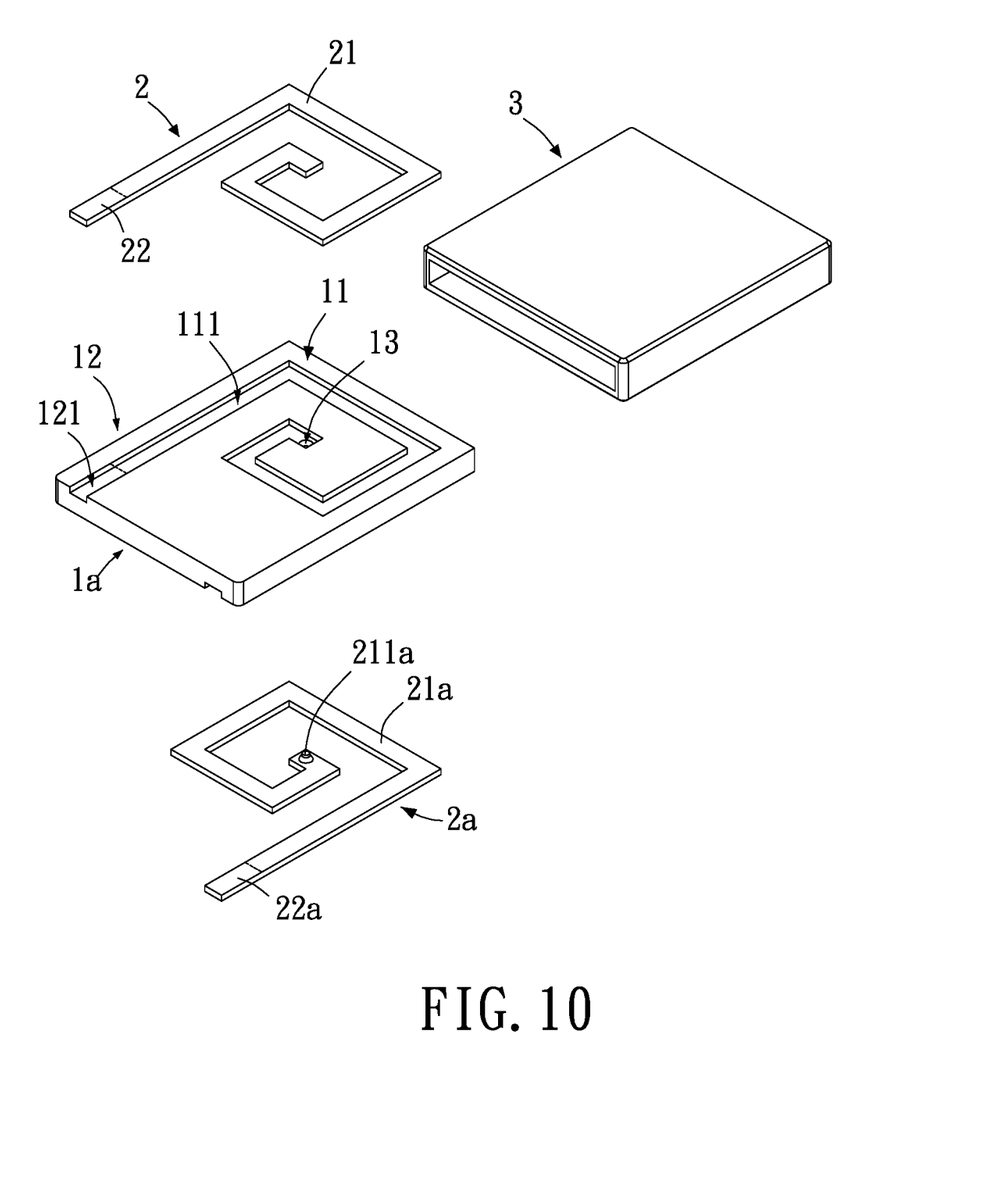
FIG. 10 is an exploded top perspective view of FIG. 9.
Figure 11:
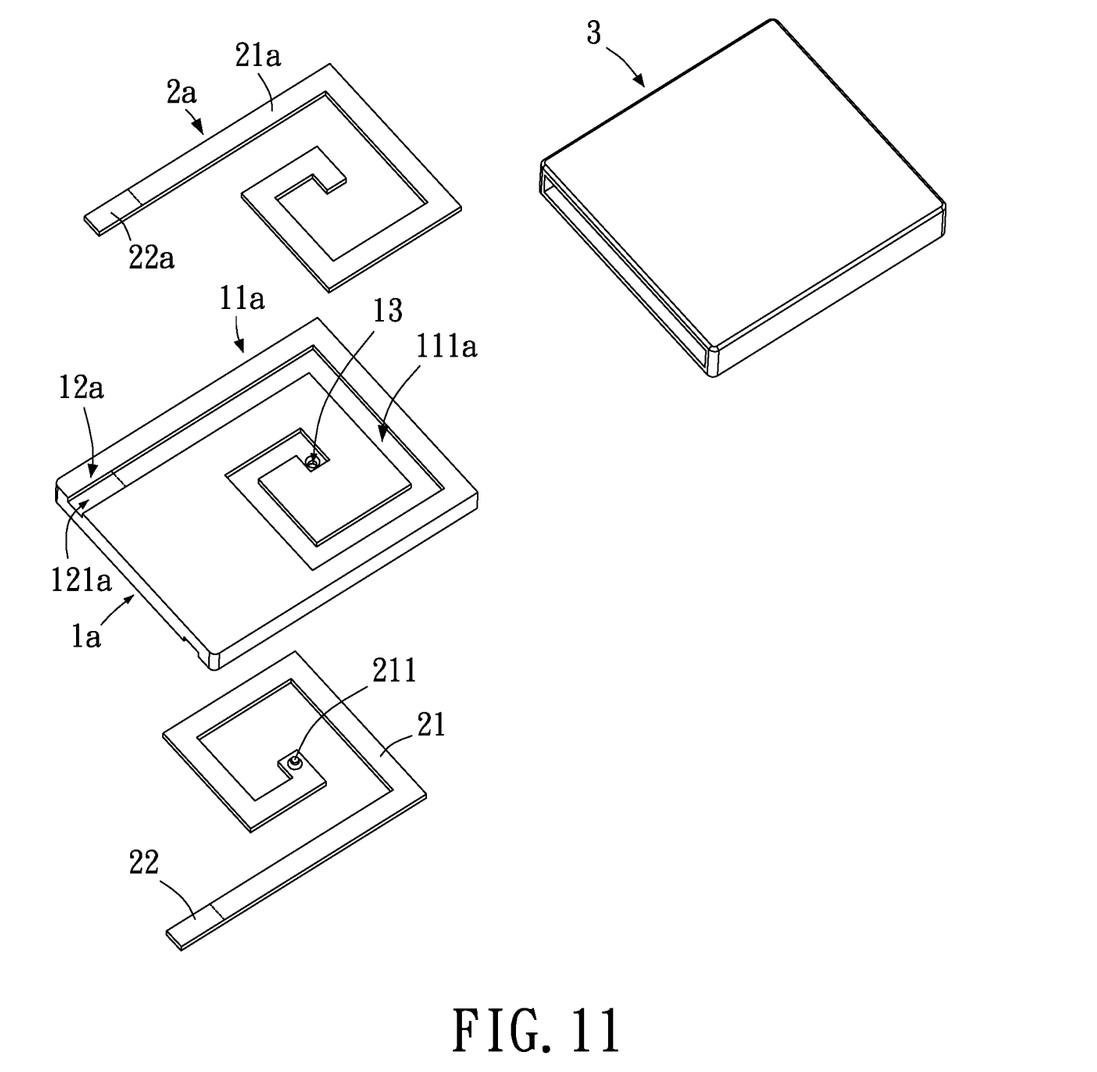
FIG. 11 is an exploded bottom perspective view of FIG. 9.

Please refer to FIGS. 9 to 11, in which a 3D circuit structure according to a fifth preferred embodiment of the present invention is shown. In the fifth preferred embodiment, the 3D circuit structure includes a 3D insulating substrate 1*a*, which is provided on one surface with a circuit forming zone 11 and an exposed contact forming zone 12, and on another opposite surface with another circuit forming zone 11*a* and another exposed contact forming zone 12*a*. The 3D insulating substrate 1*a* also includes a passage section 13 for communicating the circuit forming zones 11, 11*a* with each other. According to the fifth preferred embodiment, the circuit forming zones 11, 11*a* respectively include at least one circuit-trace receiving recess 111, 111*a*, and the passage section 13 communicates the circuit-trace receiving recesses 111, 111*a* with each other. Further, the exposed contact forming zones 12, 12*a* respectively include at least one exposed-contact receiving recess 121, 121*a*, which are located on the 3D insulating substrate 1*a* at positions adjacent to one peripheral edge thereof. The circuit forming zone 11 and the other circuit forming zone 11*a* have a circuit trace layout layer 21 and another circuit trace layout layer 21*a* disposed in the circuit-trace receiving recesses 111 and 111*a*, respectively; and the exposed-contact receiving recess 121 and the exposed-contact receiving recess 121*a* have an exposed contact 22 and an exposed contact 22*a* disposed therein, respectively. It is noted the exposed-contact receiving recesses 121, 121*a* and the exposed contacts 22, 22*a* can be located on the 3D insulating substrate 1*a* at any position, depending on an actual need in design without being limited to the positions shown in the illustrated fifth preferred embodiment. As shown, in the fifth preferred embodiment, the circuit trace layout layers 21, 21*a* respectively include an electrical conduction section 211, 211*a*, which are connected to each other via the passage section 13 to enable electrical connection of the circuit trace layout layers 21, 21*a* to each other. The circuit forming zones 11, 11*a* and the circuit trace layout layers 21, 21*a* are also covered by an insulating encapsulation member 3, while the exposed contacts 22, 22*a* are exposed to an open space. With these arrangements, the 3D insulating substrate 1*a* has a circuit pattern portion 2 and another circuit pattern portion 2*a* separately formed on two opposite surfaces thereof to thereby provide a double-sided 3D circuit structure. Again, the double-sided 3D circuit structure in the fifth preferred embodiment can have electronic elements provided on the circuit trace layout layers 21, 21*a*, and can be electrically connected to a related apparatus or other electronic components via the exposed contacts 22, 22*a* (not shown).

Figure 12:
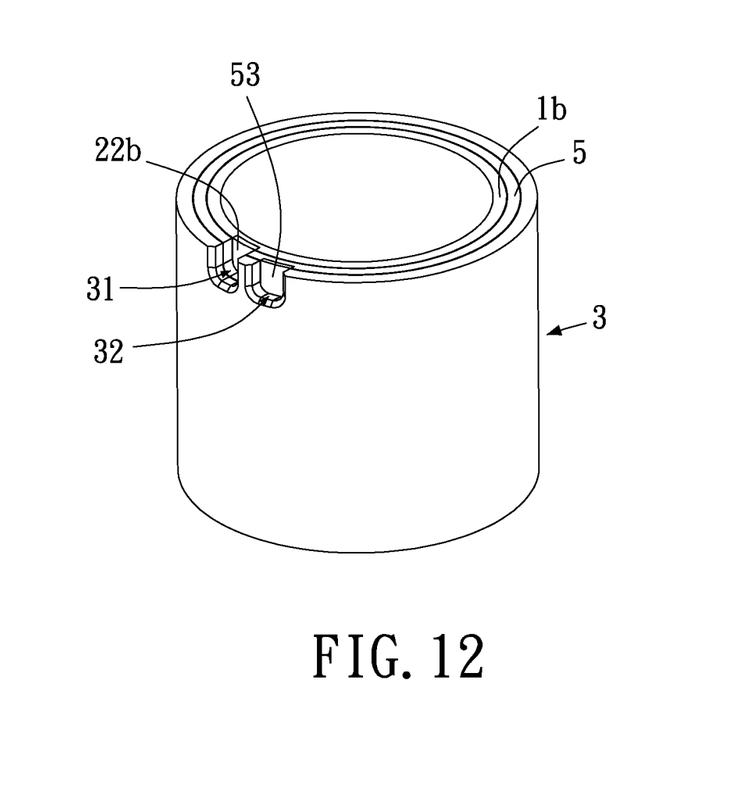
FIG. 12 is an assembled perspective view of a 3D circuit structure according to a sixth preferred embodiment of the present invention.
Figure 13:
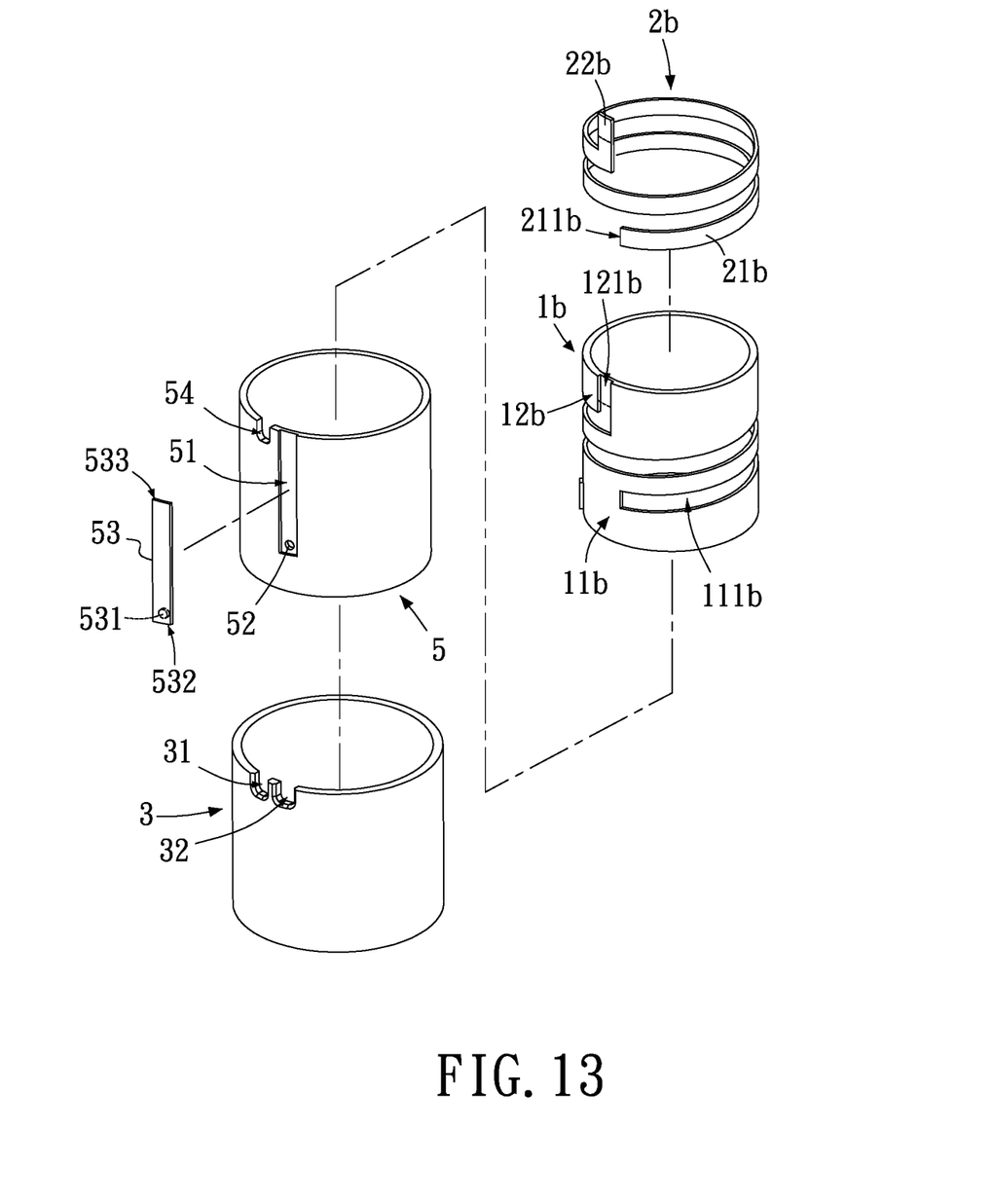
FIG. 13 is an exploded view of FIG. 12.

Please refer to FIGS. 12 and 13, which are assembled and exploded perspective views, respectively, of a 3D circuit structure according to a sixth preferred embodiment of the present invention. In the sixth preferred embodiment, the 3D circuit structure includes a 3D insulating substrate 1*b*, which is a hollow cylindrical member having a circuit forming zone 11*b* and an exposed contact forming zone 12*b*, on which a circuit-trace receiving recess 111*b* and an exposed-contact receiving recess 121*b* are provided, respectively. The circuit-trace receiving recess 111*b* and the exposed-contact receiving recess 121*b* are communicable with each other. Alternatively, the circuit forming zone 11*b* and the exposed contact forming zone 12*b* can be flat surfaces (not shown). In the sixth preferred embodiment, the circuit-trace receiving recess 111*b* is in the form of a spiral recess; and a circuit pattern portion 2*b* is provided on the 3D insulating substrate 1*b* and has a circuit trace layout layer 21*b* and an exposed contact 22*b*, which are located in the circuit-trace receiving recess 111*b* and the exposed-contact receiving recess 121*b*, respectively. That is, the circuit trace layout layer 21*b* located in the spiral circuit-trace receiving recess 111*b* is also spirally shaped. In the sixth preferred embodiment, there is an insulating intermediate layer 5 located between the 3D insulating substrate 1*b* and an insulating encapsulation member 3. The insulating intermediate layer 5 includes a conductor receiving recess 51 having at least one passage section 52 communicable with the circuit trace layout layer 21*b*. A conductor 53 made of a metal material, such as copper, nickel, gold or tin, is disposed in the conductor receiving recess 51. The conductor 53 includes a first end 532, a second end 533 and an electrical conduction section 531. The electrical conduction section 531 is disposed at the first end 532 and is communicated to one end 221*b* of the circuit trace layout layer 21*b* by penetrating the insulating intermediate layer 5 through the passage section 52. The insulating intermediate layer 5 includes a notch 54 located corresponding to the exposed contact 22b. The insulating encapsulation member 3 includes a first notch section 31 located corresponding to the notch 54 and the exposed contact 22b, and a second notch section 32 located corresponding to an end of the conductor 53. With these arrangements, a cylindrical 3D circuit structure is formed. The cylindrical 3D circuit structure can also have electronic elements provided on the circuit trace layout layer 21b of the circuit pattern portion 2b, and can be electrically connected to a related apparatus or other electronic components (not shown) via the exposed contact 22b and the conductor 53 that are located corresponding to the first and the second notch section 31, 32, respectively.

The present invention has been described with some preferred embodiments thereof and it is understood that the preferred embodiments are only illustrative and not intended to limit the present invention in any way and many changes and modifications in the described embodiments can be carried out without departing from the scope and the spirit of the invention that is intended to be limited only by the appended claims.

What is claimed is:

1. A cylindrical three-dimensional circuit structure, comprising:
   a three-dimensional (3D) insulating substrate including at least one circuit forming zone and at least one exposed contact forming zone, wherein the 3D insulating substrate is a hollow cylindrical member, the at least one circuit forming zone has a circuit-trace receiving recess, and the at least one exposed contact forming zone has an exposed-contact receiving recess;
   at least one circuit pattern portion provided on the 3D insulating substrate and including at least one circuit trace layout layer located in the circuit forming zone and at least one exposed contact located in the exposed contact forming zone and connected to the circuit trace layout layer;
   an insulating encapsulation member covering at least the circuit forming zone and the circuit trace layout layer;
   an insulating intermediate layer located between the 3D insulating substrate and the insulating encapsulation member, wherein the insulating intermediate layer includes a conductor receiving recess and a notch, the conductor receiving recess has at least one passage section, the passage section is communicable with the circuit trace layout layer; and
   a conductor, wherein the conductor is strip-shaped and on the outer surface of the insulating intermediate layer, the conductor is disposed in the conductor receiving recess, the conductor has a first end, a second end and an electrical conduction section, the electrical conduction section is disposed at the first end and is communicated to one end of the circuit trace layout layer by penetrating the insulating intermediate layer through the passage section,
   wherein the notch is located corresponding to the exposed contact, the insulating encapsulation member includes a first notch section and a second notch section, the first notch section is located corresponding to the notch and the exposed contact, the second notch section located corresponding to the second end of the conductor, the first notch section and the second notch section are adjacently at the same side of the insulating encapsulation member, and the strip-shaped conductor extends from the electrical conduction section to a position adjacent to the exposed contact.

* * * * *